United States Patent
Lee et al.

(10) Patent No.: US 9,431,099 B2
(45) Date of Patent: Aug. 30, 2016

(54) NEUROMORPHIC DEVICE WITH EXCITATORY AND INHIBITORY FUNCTIONALITIES

(71) Applicant: SNU R&DB FOUNDATION, Seoul (KR)

(72) Inventors: Jong-Ho Lee, Seoul (KR);
Chul-Heung Kim, Seoul (KR);
Sung-Yun Woo, Daegu-si (KR)

(73) Assignee: SNU R&DB FOUNDATION (KR)

( * ) Notice: Subject to any disclaimer, the term of this patent is extended or adjusted under 35 U.S.C. 154(b) by 0 days.

(21) Appl. No.: 14/935,658

(22) Filed: Nov. 9, 2015

(65) Prior Publication Data

US 2016/0133317 A1  May 12, 2016

Related U.S. Application Data

(60) Provisional application No. 62/078,017, filed on Nov. 11, 2014.

(51) Int. Cl.

| | |
|---|---|
| *H01L 29/76* | (2006.01) |
| *G11C 11/54* | (2006.01) |
| *H01L 27/115* | (2006.01) |
| *H01L 29/08* | (2006.01) |
| *H01L 29/417* | (2006.01) |

(52) U.S. Cl.
CPC .......... *G11C 11/54* (2013.01); *H01L 27/11521* (2013.01); *H01L 27/11568* (2013.01); *H01L 29/0847* (2013.01); *H01L 29/41758* (2013.01)

(58) Field of Classification Search
CPC ............. G11C 11/54; H01L 27/11521; H01L 27/11568; H01L 29/0847; H01L 29/41758
USPC ........................ 257/314, 316, 324
See application file for complete search history.

(56) References Cited

U.S. PATENT DOCUMENTS

| | | | |
|---|---|---|---|
| 7,626,228 B2 * | 12/2009 | Park ................... | G11C 16/0483 257/326 |
| 8,589,320 B2 * | 11/2013 | Breitwisch ........... | G06N 3/0635 706/15 |
| 2012/0084241 A1 | 4/2012 | Friedman et al. | |
| 2014/0129498 A1 | 5/2014 | Bichler et al. | |

OTHER PUBLICATIONS

Jo et al., Nanoscale Memristor Device as Synapse in Neuromorphic Systems, NANO Letters, 2010, pp. 1297-1301.
Suri et al., Phase Change Memory as Synapse for Ultra-Dense Neuromorphic Systems: Application to Complex Visual Pattern Extraction, IEEE, 2011, pp. 4.4.1-4.4.4.

* cited by examiner

*Primary Examiner* — Tu-Tu Ho
(74) *Attorney, Agent, or Firm* — Cantor Colburn LLP

(57) ABSTRACT

Provided is a neuromorphic device including first and second lower electrodes formed on a substrate to be electrically separated, first and second lower insulating film stacks formed at least on respective surfaces of the first and second lower electrodes, first, second, and third doped regions formed at left and right sides of the first and second lower electrodes, first and second semiconductor regions formed on the first and second lower insulating film stacks, an upper insulating film stack formed on the first and second semiconductor regions and the first, second, and third doped regions, and an upper electrode formed on the upper insulating film stack. Accordingly, a specified neuromorphic device can be reconfigured to have arbitrarily inhibitory or excitatory functionality by using the first and second lower electrodes and the lower insulating film stacks including charge storage layers formed on the surfaces of the electrodes.

19 Claims, 17 Drawing Sheets

NEUROMORPHIC DEVICE WITH EXCITATORY AND INHIBITORY FUNCTIONALITIES

FUNDING STATEMENT

This invention was supported by Samsung Research Funding Center of Samsung Electronics under Project Number SRFC-IT1301-08.

BACKGROUND OF THE INVENTION

1. Field of the Invention

The present invention relates to a neuromorphic device imitating a synapse, a synapse array, or a neuron in a neuromorphic technique.

2. Description of the Related Art

Recently, in integrated circuits based on a Von Neumann architecture, power consumption has been greatly increased, and the problem of heat release has been very serious. Therefore, in the field of Von-Neumann-based integrated circuits, many approaches to imitate nervous systems of animals have been studied. In particular, in techniques of imitating the nervous systems of animals, the power consumption can be greatly reduced, and perceiving and learning are enabled, so that perception and determination functions can be improved. Accordingly, the functions of existing Von-Neumann-based integrated circuits are expected to be greatly improved or replaced by using the techniques of imitating the nervous systems of animals. Therefore, much attention has been increasingly paid on the techniques of imitating the nervous systems of animals, and there is much need to study techniques of imitating the nervous systems of animals.

A basic function of a neuron is to generate an electrical spike (signal) from a stimulus exceeding a threshold value and transmit information to another cell. The generated electrical signal is called an action potential. A neuron may be mainly divided into three portions. Namely, the neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or stimulus receptor cell and transmits the stimulus to another nerve cell or glandular cell. Exchanging stimuli occurs in the synapse. One nerve cell (neuron) receives stimuli through a plurality of the synapses to integrate excitations, and after that, the nerve cell transmits an electrical spike to an axon near to the nerve cell body, so that the electrical spike reaches the synapse.

In this manner, the transmission of excitations from the neuron through the synapse to another nerve cell is referred to as excitation transmitting. The excitation in the synapse is transmitted only in the direction from a nerve fiber to a nerve cell body or a dendrite and is not transmitted in the reverse direction. As a whole, the synapse transmits the excitation only in the one direction.

In addition, the synapse is a relay site of transmitting the excitations, and the synapse applies a weighting factor according to temporal or spatial change of excitations reaching the synapse or make inhibition to enable a high-level integrating function of the nerve system.

On the other hand, besides the synapse which transmits the excitations, there are some synapses having a function of inhibiting the excitations of the nerve cell. The synapse having the function is called an inhibitory synapse. When the excitation transmitted along nerve fiber reaches the inhibitory synapse, the synapse secretes an inhibitory transmitting material. The inhibitory material acts on a membrane of the nerve cell connected to the synapse to inhibit excitations of the cell from occurring (occurrence of an action potential). As a result, while the inhibitory transmitting material acts, the excitation reaching another synapse is not transmitted to the synapse.

In this manner, the neuron performs an excitation transmitting function of transmitting excitations received from one or more nerve cells through the synapse to another nerve cell, an excitation integrating/transmitting function of integrating excitations received from a plurality of nerve cells and transmitting an integrated excitation to another nerve cell, or an excitation inhibiting function of inhibiting an excitation from be transmitted from another nerve cell.

The present invention is to provide a neuromorphic device capable of imitating various functions such as excitation integrating, transmitting, and inhibiting functions performed by the neuron and the synapse.

In the related art, there are mainly memrister-based techniques and SRAM-based techniques. In the memrister-based techniques, an existing RRAM or PRAM is mainly used, and in some cases, an STT-MRAM is used. Since two-terminal elements are basically used, these techniques seem to be simple. However, in implementation of an actual synapse array, complexity of interconnection for the excitatory or inhibitory functionality is greatly increased. In addition, there is a problem in that, as a limitation of the two-terminal element in an array environment, a selection element needs to be installed in each neuromorphic device. In the case of using the RRAM or the PRAM, an analog memory suitable for imitating the functions of the synapse can be implemented. However, in the case of using the SRAM, since the SRAM is a digital memory, there is a limitation to implement one synapse. In particular, the case of using the RRAM has a serious problem in durability, and the case of using the PRAM has a problem in durability and a problem according to high power consumption. Since an existing SRAM cell for imitating the synapse is typically configured with eight transistors, the occupied area is too large, and there is a limitation as a digital memory described above. Therefore, there is a serious problem in degree of integration.

US Patent Laid-Open Nos. US 2014-0129498 and US 2012-0084241 are disclosed as the related art.

Nanoscale Memristor Device as Synapse in Neuromorphic Systems (Nano Lett. 10, 4(2010)) and Phase Change Memory as Synapse for Ultra-Dense Neuromorphic Systems: Application to Complex Visual Pattern Extraction (IEEE IEDM (2011)) are disclosed as the related art.

SUMMARY OF THE INVENTION

The present invention is to provide a neuromorphic device capable of having excellent reliability, lower power consumption, and a high degree of integration while solving problems of existing neuromorphic devices.

According to a first aspect of the invention, there is provided a neuromorphic device including: first, second, and third doped regions which are formed with a semiconductor material doped with impurities on a substrate to be electrically separated by a predetermined distance from each other and to be electrically isolated from each other; a first lower electrode which is disposed between the first doped region and the second doped region to be electrically insulated from the first and second doped regions; a second lower electrode which is disposed between the second doped region and the third doped region to be electrically insulated from the second and third doped region; a first lower insulating film stack which is disposed at least on a surface of the first lower electrode; a second lower insulating film stack which is disposed at least on a surface of the second lower electrode; a first semiconductor region which is formed on a top surface of the first lower insulating film stack to connect the first doped region and the second doped region; a second semiconductor region which is formed on a top surface of the second lower insulating film stack to connect the second doped region and the third doped region; an upper insulating film stack which is formed on top surfaces of the first and second semiconductor regions; and an upper electrode which is disposed on the upper insulating film stack.

In the neuromorphic device array according to the first aspect, preferably, the neuromorphic device further includes lower insulating film stacks between the substrate and the first doped region, between the substrate and the second doped region, and between the substrate and the third doped region.

In the neuromorphic device array according to the first aspect, preferably, each of the first and second lower insulating film stacks is configured in a structure where a plurality of layers including at least a charge storage layer and an insulating film are stacked.

According to a second aspect of the invention, there is provided a neuromorphic device array including a plurality of neuromorphic devices, wherein the neuromorphic devices share first and second lower electrodes and first, second, and third doped regions, and the neuromorphic devices are connected to each other through a plurality of upper electrodes which are electrically separated from each other.

In the neuromorphic device array according to the second aspect, preferably, first and second semiconductor regions are shared between the adjacent neuromorphic devices in the array configured with a plurality of the neuromorphic devices, and voltages of the first and second semiconductor regions and a voltage of the second doped region are controlled by using a first electrode which is electrically in contact with the first and second semiconductor regions shared between the adjacent neuromorphic devices and the second doped region.

In the neuromorphic device array according to the second aspect, preferably, each of the first and second lower insulating film stacks of each neuromorphic device of the neuromorphic device array includes a charge storage layer, and in the case of selectively storing positive or negative charges in the charge storage layers of the first and second lower insulating film stacks of a specified neuromorphic device, a voltage is applied to the upper electrodes of the other neuromorphic devices, so that storing charges in the other neuromorphic devices is negligible.

In the neuromorphic device array according to the second aspect, preferably, the first and third doped regions shared in the neuromorphic device array are formed to be connected to two respective independent paths of a current mirror circuit.

A neuromorphic device according to the present invention is configured to include two MOS transistors including a common source and to read information stored in a charge storage layer enabling a memory function, so that the neuromorphic device can imitate an excitation transmitting function of neurons and synapses. In addition, the neuromorphic device according to the present invention is configured with two elements, so that the area of the neuromorphic device can be reduced.

In addition, the two MOSFETs included in one neuromorphic device in order to imitate one synapse are controlled to have different threshold voltages in a positive or negative region, and thus, when an input voltage to the neuromorphic device is 0 V (or the synapse is not operated), no current flows, so that power consumption can be reduced.

In addition, the neuromorphic device configured to include two MOSFETs can be controlled to have an excitatory or inhibitory functionality in a reconfigurable manner, so that the area of the neuromorphic device can be efficiently used. In addition the neuromorphic device according to the present invention can implement a spike timing dependent plasticity (STDP) function, a short term plasticity (STP) function, and long term plasticity (LTP) function as well as a memory function while occupying a small area. In addition, functions of a biological synapse are imitated on the basis of semiconductor FETs, and thus, selection elements causing problems in existing memrister-based techniques can be removed, so that durability and reliability can be greatly improved.

In comparison with existing neuromorphic devices, according to the present invention, it is possible to provide a neuromorphic device capable of imitating functions of neurons and synapses such as an excitation transmitting function, an excitation integrating/transmitting function, and excitatory and inhibitory functionalities and having excellent durability and a high degree of integration.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention is to provide a neuromorphic device capable of effectively imitating a neuron circuit and having excellent durability and an excellent degree of integration. In particular, since the neuromorphic device is adjusted to have inhibitory or excitatory functionality according to a program or erase operation, the neuromorphic device allows synapses and neutrons to be effectively embodied in terms of interconnections and area. Besides the inhibitory or excitatory functionality, the neuromorphic device allows spike timing dependent plasticity (STDP), short term plasticity (STP), and long term plasticity (LTP) to be embodied in a small area. In addition, since a current does not flow in response to an input voltage corresponding to an off state, a low power configuration of the neuromorphic device can be embodied.

Conceptually, the neuromorphic device according to the present invention is configured to include two integrated FET elements which share one source S and include two drains, that is, first and second drains D1 and D2 which are electrically isolated from each other. Semiconductor materials where channels are formed are disposed between the common source and the drains. A gate insulating film stack is formed on at least one side of these materials, and the stack has a memory function. A gate electrode is formed on the other side of the gate insulating film stack. The gate electrodes of the two integrated elements are electrically connected.

Hereinafter, the neuromorphic devices according to exemplary embodiments of the present invention will be described in detail with reference to the attached drawings.

Figure 1:
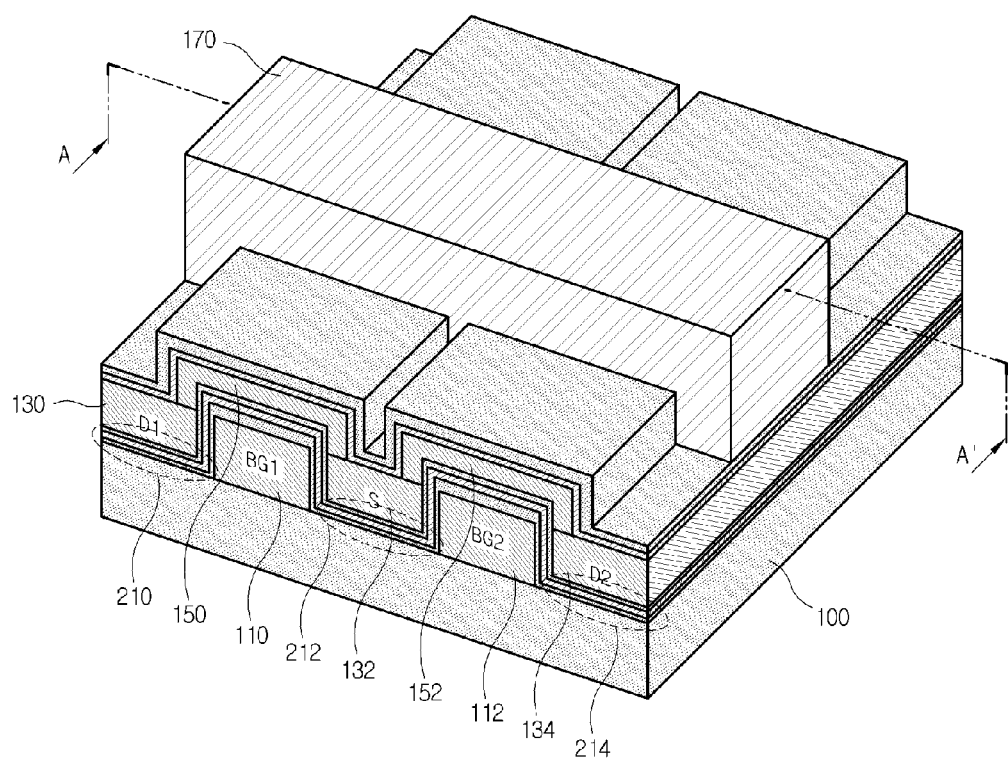
FIG. 1 is a perspective diagram illustrating a neuromorphic device according to a first embodiment of the present invention.
Figure 2:
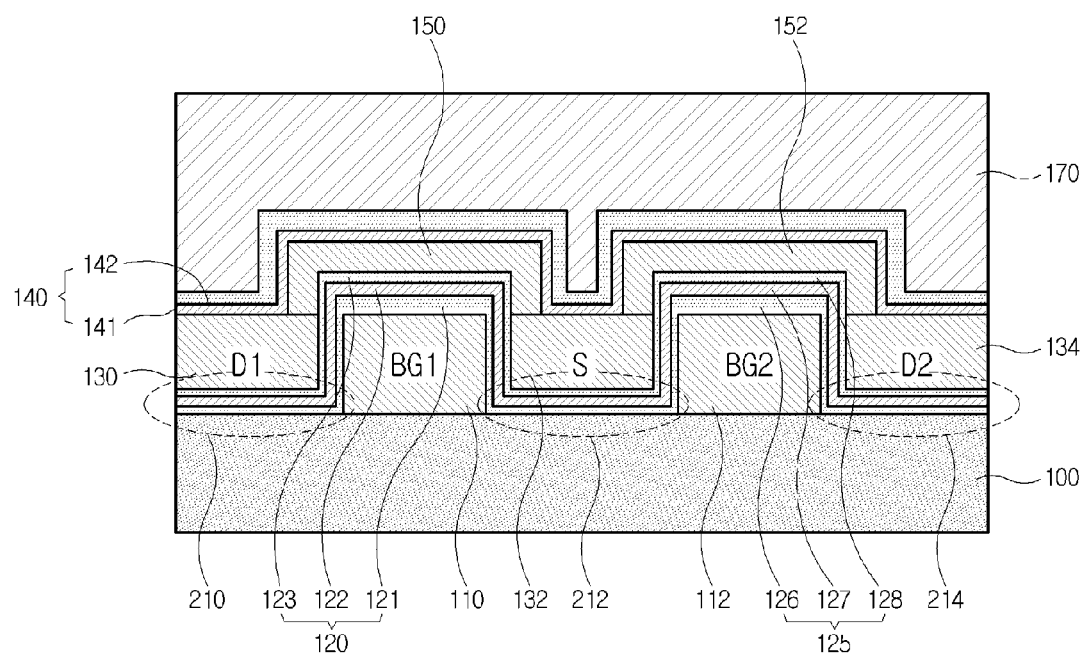
FIG. 2 is a cross-sectional diagram taken line A-A' of FIG. 1.

FIG. 1 is a perspective diagram illustrating a neuromorphic device according to a first embodiment of the present invention. FIG. 2 is a cross-sectional diagram taken along line A-A' of FIG. 1.

Referring to FIGS. 1 to 2, the neuromorphic device 10 according to the embodiment is configured to include a substrate 100, first and second lower electrodes (BG1 and BG2) 110 and 112 which are formed on the substrate to be electrically isolated from each other, a first lower insulating film stack 120 which is formed on a top surface and sidewalls of the first lower electrode, a second lower insulating film stack 125 which is formed on a top surface and sidewalls of the second lower electrode, a first, second, and third doped regions 130, 132, and 134 which are formed at the left and right of the first and second lower electrode, first and second semiconductor regions 150 and 152 which are formed on the first and second lower insulating film stacks, an upper insulating film stack 140 which is formed on the first and second semiconductor regions and the first, second, and third doped regions, and an upper electrode (top gate) 170 which is formed on the upper insulating film stack. In addition, the neuromorphic device is configured to further include lower insulating film stacks 210, 212, and 214 between the first doped region 130 and the substrate 100, between the second doped region 132 and the substrate 100, and between the third doped region 134 and the substrate 100.

The aforementioned components of the neuromorphic device will be described more in detail.

As the substrate 100, a semiconductor substrate or an insulating film substrate such as an $SiO_2$ substrate may be used.

The first and second lower electrodes (BG1 and BG2) 110 and 112 are formed on the substrate 100 to be electrically isolated from each other. The first lower insulating film stack 120 is formed on the top surface and sidewalls of the first lower electrode 110. The second lower insulating film stack 125 is formed on the top surface and sidewalls of the second lower electrode 112.

Each of the first and second lower insulating film stacks 120 and 125 may be configured by stacking a plurality of insulating films. In addition, each of the first and second lower insulating film stacks 120, 125 includes a charge storage layer 122, 127 capable of storing electric charges, so that a nonvolatile memory function can be implemented. The upper insulating film stack 140 may be configured with a single insulating film or a plurality of insulating films. In the case where the upper insulating film stack includes a plurality of the insulating films 142, 141, the upper insulating film stack may include a charge storage layer.

Each of the first and second lower insulating film stacks 120, 125 and the upper insulating film stack 140 may be formed, for example, in a stack structure of a blocking insulating film 123, 128, a charge storage layer 122 and 127, and a tunneling insulating film 121, 126, in a stack structure of a charge storage layer and a tunneling insulating film, or in a stack structure of a blocking insulating film and a charge storage layer.

In addition, the charge storage layer may be formed as a single layer or in a stack structure of two or more layers configured with materials having different dielectric constants or materials having different depths of traps for storing electric charges. Preferably, the charge storage layer is formed as two or more layers configured with materials having different dielectric constants, so that a short-term memory for storing data in a short term and a long-term memory for storing data in a long term can be simultaneously implemented. In the case where the charge storage layer is configured with two layers, the short-term memory may be implemented in the lower layer, and the long-term memory may be implemented in the upper layer. By adjusting pulse size or width and the number of pulses in a program or erase operation, the short-term and long-term memories can be implemented.

The lower insulating film stacks 210, 212, and 214 may be formed in the same structure as that of the first and second lower insulating film stacks described above. As another example, except for the first and second lower insulating film stacks formed on the surfaces of the first and second lower electrodes the lower insulating film stack may not include the charge storage layer.

In the case where the charge storage layer exists in the upper insulating film stack 140, electric charges can be supplied to or removed from the first and second semiconductor regions 150 and 152 or the upper electrode 170.

The charge storage layers included in the first and second lower insulating film stacks and the charge storage layer included in the upper insulating film stack may be configured so that the charge storing time periods thereof are different. Preferably, the structures and materials of the charge storage layers are set according to the charge storing time periods required for the charge storage layers. The charge storage layer may be configured with any one selected from a nitride, a metal oxide, nano particles, and conductive materials. For example, in the case where the STP function of the neuromorphic device is implemented by the upper insulating film stack, preferably, a leaky memory is configured by using the charge storage layer of which the charge storing time period is short. On the other hand, in the case where the LTP function of the neuromorphic device is implemented by the upper insulating film stack, preferably, a permanent memory is configured by using the charge storage layer of which the charge storing time period is long. This can be configured freely according to the application of the device.

The amount of electric charges stored in the charge storage layer of the upper insulating film stack can be detected and copied to be stored in both or one of the charge storage layers of the first and second lower insulating film stacks. By using this configuration, as an example, information stored in the charge storage layer of the upper insulating film stack configured for the short-term memory and the STDP function can be stored in the charge storage layers of the first and second lower insulating film stacks configured for permanently storing electric charges. In other words, results of learning can be periodically and permanently stored in a storage device.

The first, second, and third doped regions 130, 132, and 134 are formed on the side surfaces of the first and second lower electrodes 110 and 112. The first lower insulating film stack is disposed between the first doped region and the first lower electrode and between the first lower electrode and the second doped region. The second lower gate insulating film stack is disposed between the second doped region and the second lower electrode and between the second lower electrode and the third doped region.

The first semiconductor region 150 is formed on the top surface of the first lower insulating film stack to connect the first and second doped regions to each other. The second semiconductor region 152 is formed on the top surface of the second lower insulating film stack to connect the second and third doped regions to each other. Therefore, the first and second semiconductor regions function as channels of the FET elements.

Accordingly, the first, second, and third doped regions are disposed at the two ends of the first and second semiconductor regions operating as the channels of the FET elements, so that the second doped region functions as a common source and the first and third doped regions function as drains. Therefore, conceptually, the neuromorphic device according to the present invention is configured to include two integrated FET elements which share one source and include two drains, that is, first and second drains D1 and D2 which are electrically separated from each other. The first and second semiconductor regions where channels are formed are disposed between the common source and the first drain and between the common source and the second drain. The gate insulating film stack is disposed on at least one side surface of the first and second semiconductor regions. The gate insulating film stack may have a memory function. The upper or lower electrode as a gate electrode is formed at one side of the gate insulating film stack. The upper electrode is electrically connected to the two integrated elements.

The first and second lower insulating film stacks may be configured to surround the surfaces of the first and second lower electrodes, respectively. The first and second lower insulating film stacks may be configured to be disposed at least between the first and second lower electrodes and the first and second semiconductor regions.

The upper insulating film stack may be formed on the top surfaces of the first and second semiconductor regions and the top surfaces of the first, second, and third doped regions.

Figure 3:
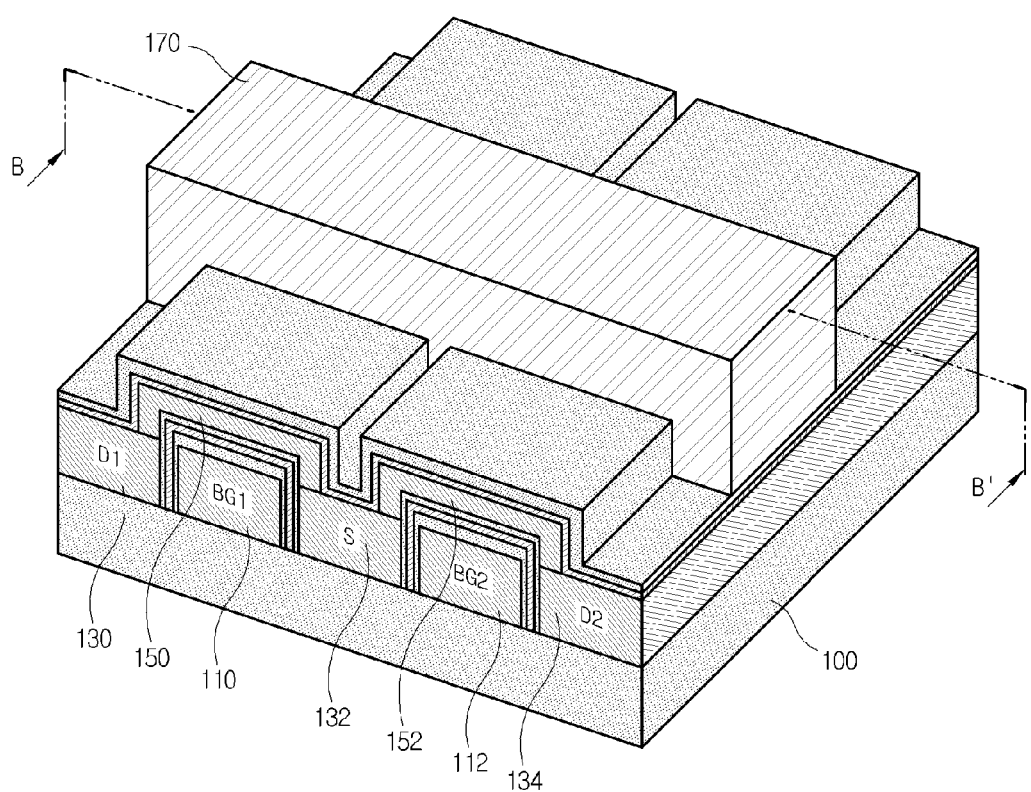
FIG. 3 is a perspective diagram illustrating a neuromorphic device according to a second embodiment of the present invention.
Figure 4:
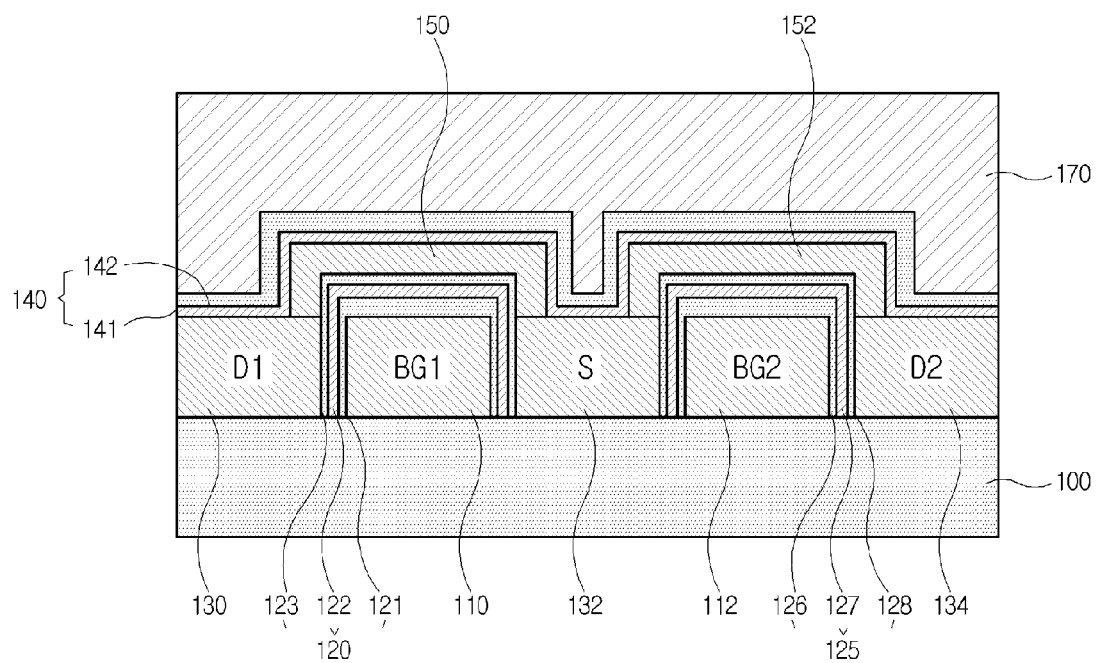
FIG. 4 is a cross-sectional diagram taken line B-B' of FIG. 3.

FIG. 3 is a perspective diagram illustrating a neuromorphic device according to a second embodiment of the present invention. FIG. 4 is a cross-sectional diagram taken along line B-B' of FIG. 3.

Referring to FIGS. 3 and 4, the neuromorphic device according to the second embodiment has a structure similar to that of the neuromorphic device according to the first embodiment except that lower insulating film stacks are not formed between the first doped region and the substrate, between the second doped region and the substrate, and between the third doped region and the substrate. Therefore, the first doped region 130, the second doped region 132, and the third doped region 134 are formed directly on the substrate 100.

In the above-described neuromorphic devices according to the first and second embodiments, programming and erasing can be performed element by element by using the first and second lower electrodes and the upper electrode. In the neuromorphic device according to the present invention, functions of the elements can be reconfigured by the above-described programming and erasing. As a result, excitatory and inhibitory functionalities can be set for each neuromorphic device.

Each of the neuromorphic devices according to the first and second embodiments having the above-described configuration is configured with two nMOSFETs. Now, the implementation of the excitatory and inhibitory functionalities in the neuromorphic device is described.

Figure 5:
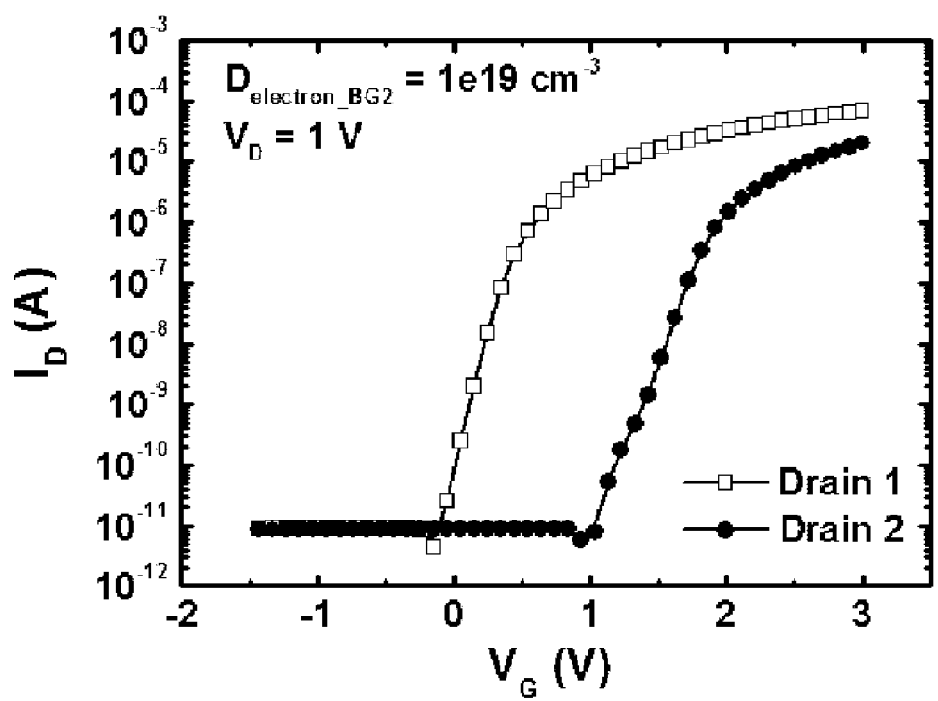
FIG. 5 is a graph illustrating current-voltage characteristics between a common source S and two drains D1 and D2 in one neuromorphic device based on two n-type MOSFETs in the case where a threshold value of a channel between the source and the drain D1 is low.

Referring to FIG. 5, if the neuromorphic device configured with, for example, two nMOSFETs is programmed through the second lower electrode (BG2), the threshold voltage is increased, so that small current or no current flows through the channel formed on the second lower electrode in the read operation. On the contrary, large current flows through the channel formed on the first lower electrode since the threshold voltage is low. Therefore, the neuromorphic device which is set in this manner can be defined to have excitatory or inhibitory functionality. For example, the above case is defined as the excitatory functionality. Namely, in the neuromorphic device which is set to have the excitatory functionality, relatively large current can be flowed from the first drain (D1) as the first doped region to the source as the second doped region.

Figure 6:
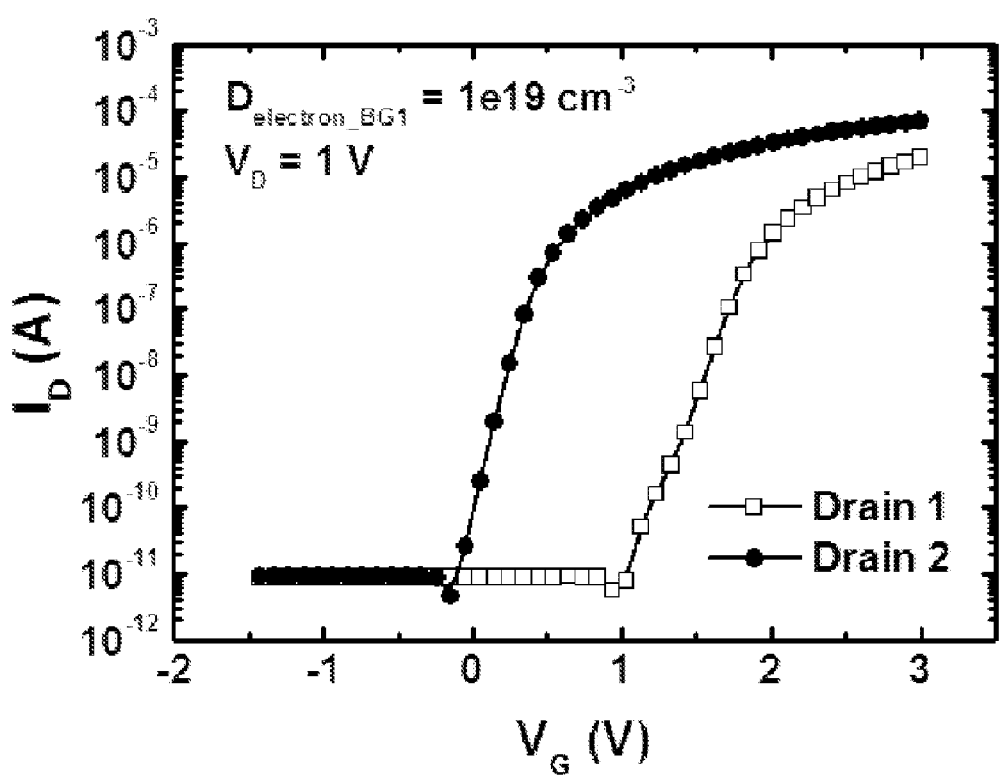
FIG. 6 is a graph illustrating current-voltage characteristics between a common source S and two drains D1 and D2 in one neuromorphic device based on two n-type MOSFETs in the case where a threshold value of a channel between the source and the drain D2 is low.

Referring to FIG. 6, if the neuromorphic device configured with, for example, two nMOSFETs is programmed through the first lower electrode (BG1), the threshold voltage is increased, so that small current or no current flows through the channel formed on the first lower electrode in the read operation. On the contrary, large current flows through the channel formed on the second lower electrode since the threshold voltage is low. Therefore, the neuromorphic device which is set in this manner can be defined to have excitatory or inhibitory functionality. For example, the above case is defined as the inhibitory functionality. Namely, in the neuromorphic device which is set to have the inhibitory functionality, relatively large current can be flowed from the second drain (D2) as the third doped region to the source as the second doped region.

Each of the neuromorphic devices according to the first and second embodiments having the above-described configuration is configured with two nMOSFETs. The specified neuromorphic device can be set to have excitatory or inhibitory functionality as described above. Besides, the threshold values of both of the two nMOSFETs in the specified neuromorphic device are increased, and thus, in the read operation, the two elements can be maintained in the OFF state. On the contrary, if the threshold voltages are allowed to be decreased, both of the two elements can be maintained in the ON state.

For the convenience of description, it is assumed that one neuromorphic device includes two nMOSFETs. The neuromorphic device can be configured with two pMOSFETs to be set to have the excitatory or inhibitory functionality, and both of the two pMOSFETs may be set to OFF or ON.

Each of the neuromorphic devices according to the first and second embodiments having the above-described configuration can be configured in a form of an array, and thus, a plurality of the neuromorphic devices are disposed in the same array. Each neuromorphic device can be set to be in one of excitatory, inhibitory, OFF, and ON states as described above.

In addition, each of the neuromorphic devices according to the first and second embodiments can have inhibitory or excitatory functionality. In addition, since the upper insulating film stack on the semiconductor region can be programmed or erased by comparing a pre-signal applied to the gate of the neuromorphic device and a post-signal fed back to the body (body contact) and the source through the neuron circuit, the spike timing dependent plasticity (STDP) function of adjusting the weighting factor of the neuromorphic device can be implemented. In addition, due to the process, in the neuromorphic device according to the present invention, the short-term plasticity (STP) function and the long-term plasticity (LTP) function can be implemented. Due to these functions, the neuromorphic device can perform learning. These functions can be implemented in a small area with reliability.

Figure 7:
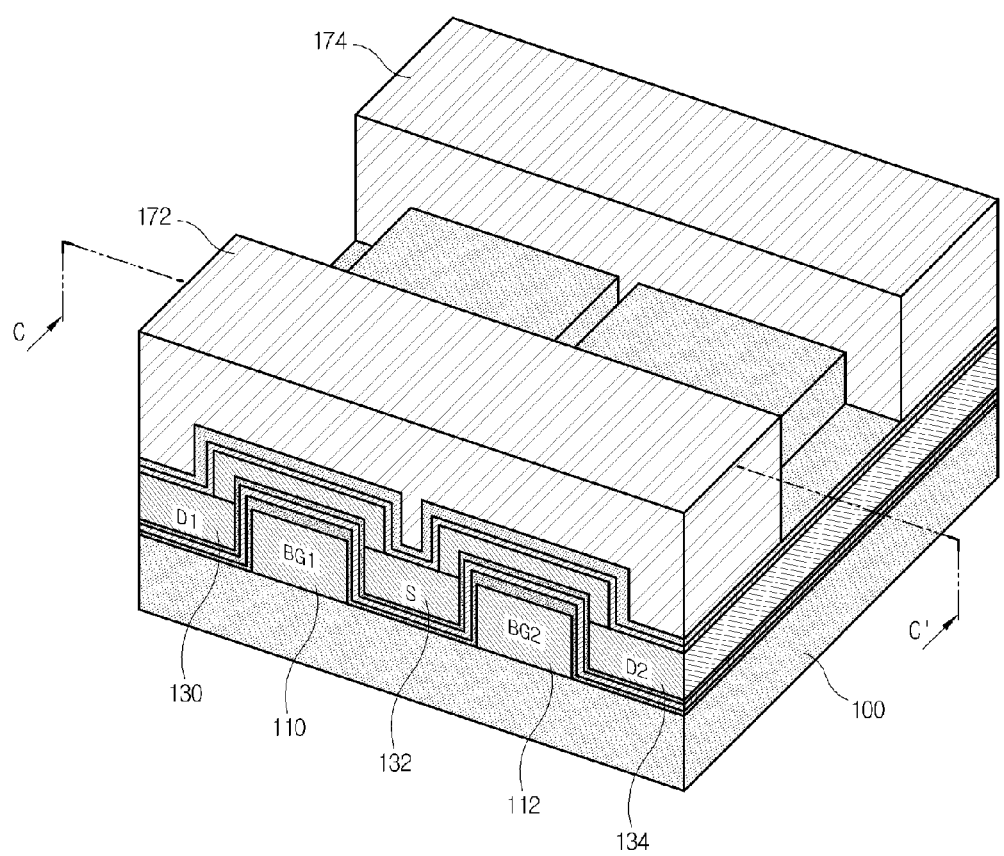
FIG. 7 is a perspective diagram illustrating a configuration of an array of the neuromorphic devices according to the first embodiment of the present invention.

On the other hand, each of the neuromorphic devices according to the first and second embodiments having the above-described configuration can be manufactured by connecting the first and second drains D1 and D2 as the first and third doped regions to the source as the second doped region in the array of the neuromorphic devices. FIG. 7 is a perspective diagram illustrating a configuration of an array of the neuromorphic devices according to the first embodiment of the present invention. Referring to 7, a plurality of the upper electrodes (top gates) 172 and 174 are formed on the upper insulating film stack, so that the neuromorphic devices can be configured in a form of an array.

Several neuromorphic devices are connected in a form of an array, and the array is operated as a portion of one neuron imitating circuit. In the above neuron array, the first and third doped regions are connected to different current paths included in the current mirror circuit. In the array, the inhibitory or excitatory functionality is implemented by supplying or extracting drain currents in the charge storage unit (capacitor).

In the case where the array of the neuromorphic devices according to the first and second embodiments is configured, electric contacts for controlling the voltages of the first and second semiconductor regions where the channels are to be formed may be configured in various manners.

Figure 8:
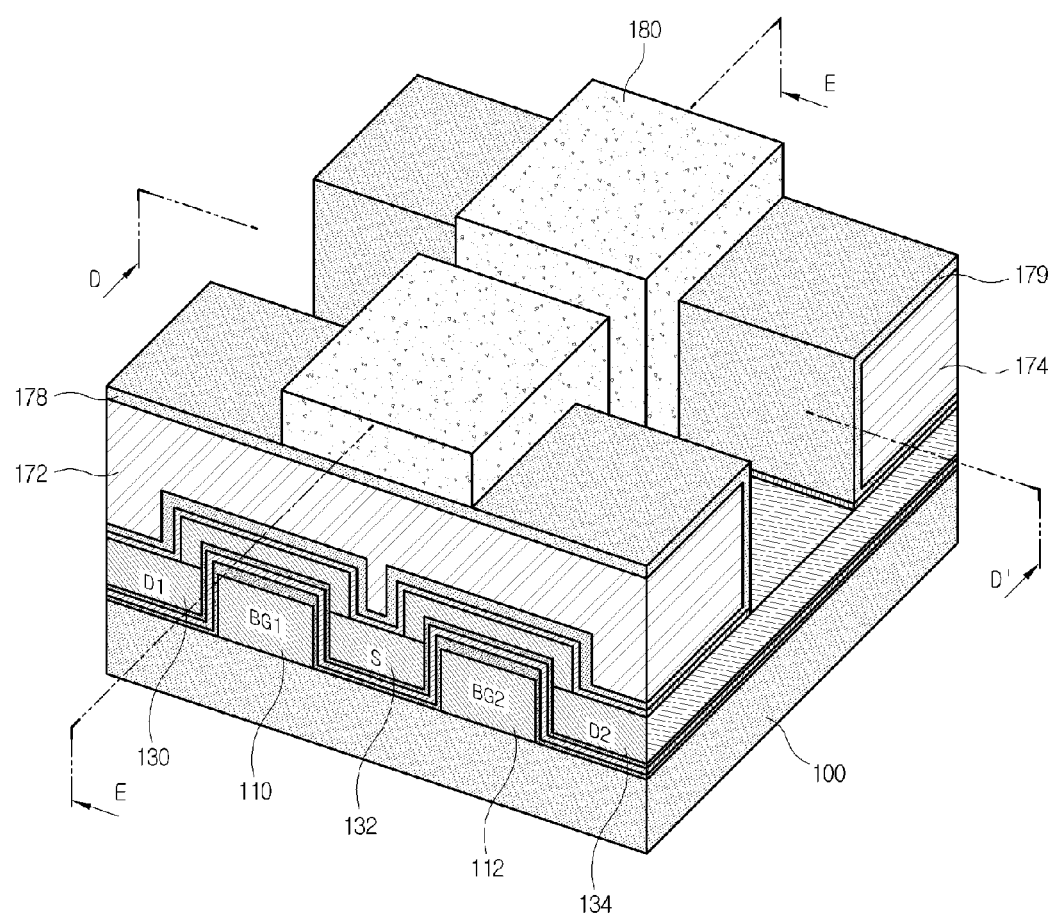
FIG. 8 is a perspective diagram illustrating an embodiment of electrical contacts to first and second semiconductor regions in an array structure of the neuromorphic device according to the present invention.
Figure 9:
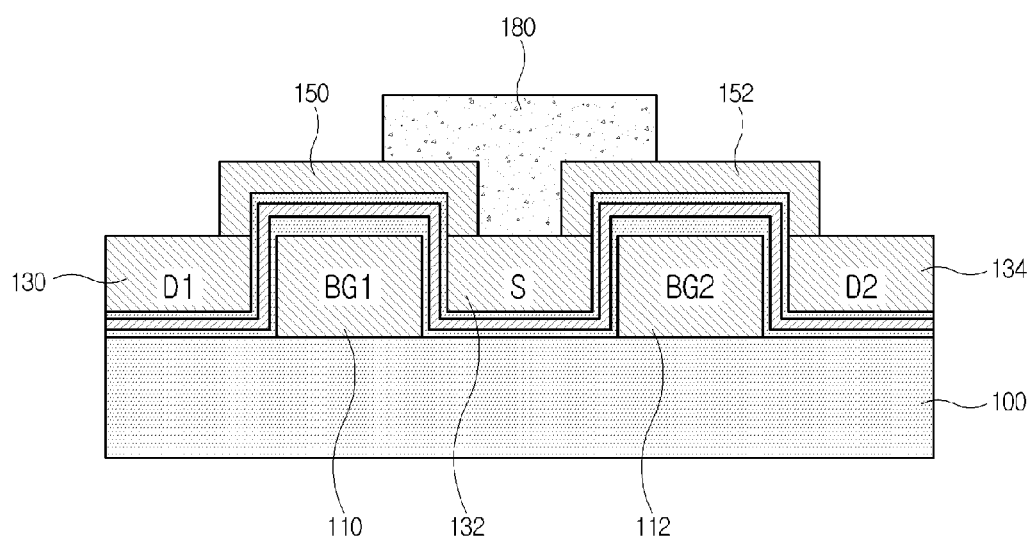
FIG. 9 is a cross-sectional diagram taken line D-D' of FIG. 8.
Figure 10:
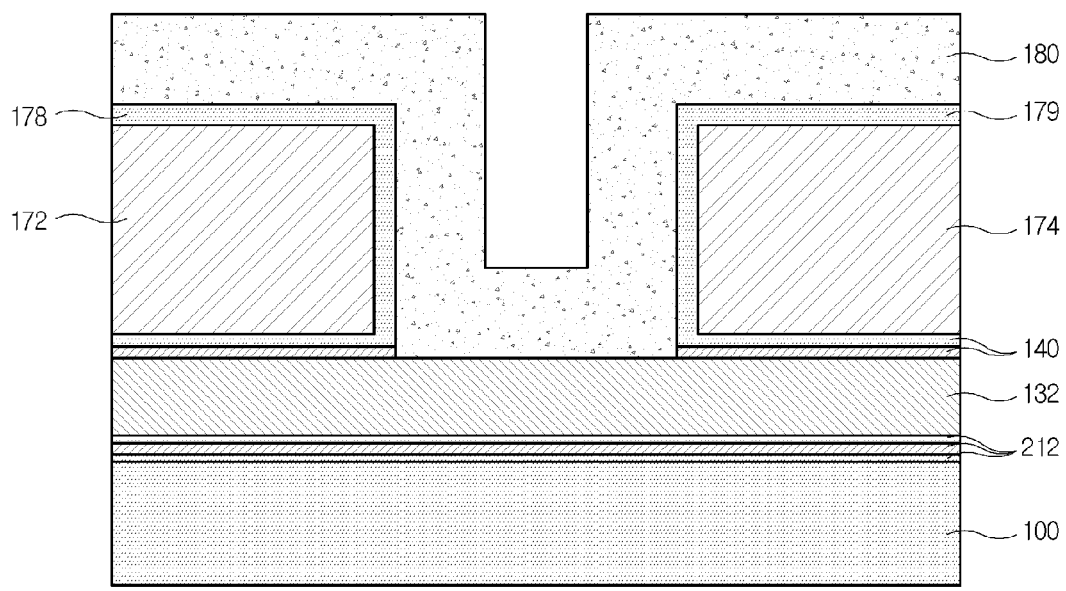
FIG. 10 is a cross-sectional diagram taken line E-E' of FIG. 8.

FIG. 8 is a perspective diagram illustrating an embodiment of electrical contacts to the first and second semiconductor regions in the array structure of the neuromorphic device according to the present invention. FIG. 9 is a cross-sectional diagram taken along line D-D' of FIG. 8. FIG. 10 is a cross-sectional diagram taken along line E-E' of FIG. 8. As illustrated in FIGS. 8 to 10, in the array of the neuromorphic devices, the channel contacts can provide electrical contacts to the first and second semiconductor regions where the channels of the FET elements are to be formed. The voltages of the first and second semiconductor regions 150 and 152 where the channels are to be formed are controlled through the channel contacts. Since the first and second semiconductor regions and the source 132 are applied with the same voltage in the feedback operation or the like, preferably, the first and second semiconductor regions and the source 132 are electrically connected to each other. In FIGS. 9 and 10, the first electrode 180 is electrically connected to a portion of the first and second semiconductor regions and the source. In the figures, the first electrode is formed on the first and second semiconductor regions.

Figure 11:
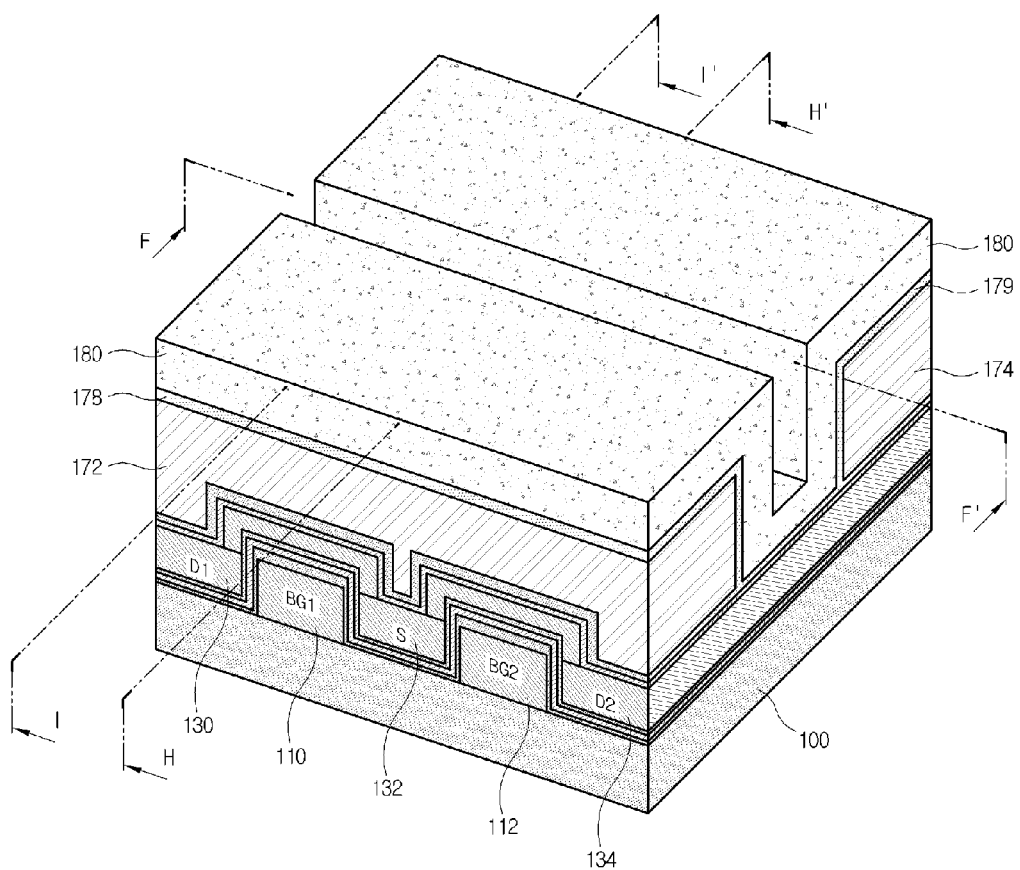
FIG. 11 is a perspective diagram illustrating another embodiment of the electrical contacts to the first and second semiconductor regions in the array structure of the neuromorphic device according to the present invention.
Figure 12:
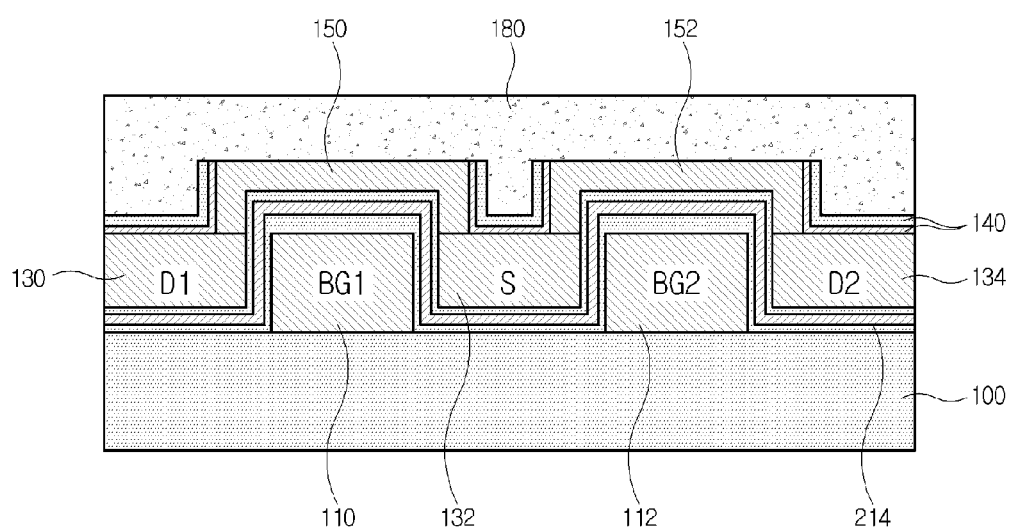
FIG. 12 is a cross-sectional diagram taken line F-F' of FIG. 11.
Figure 13:
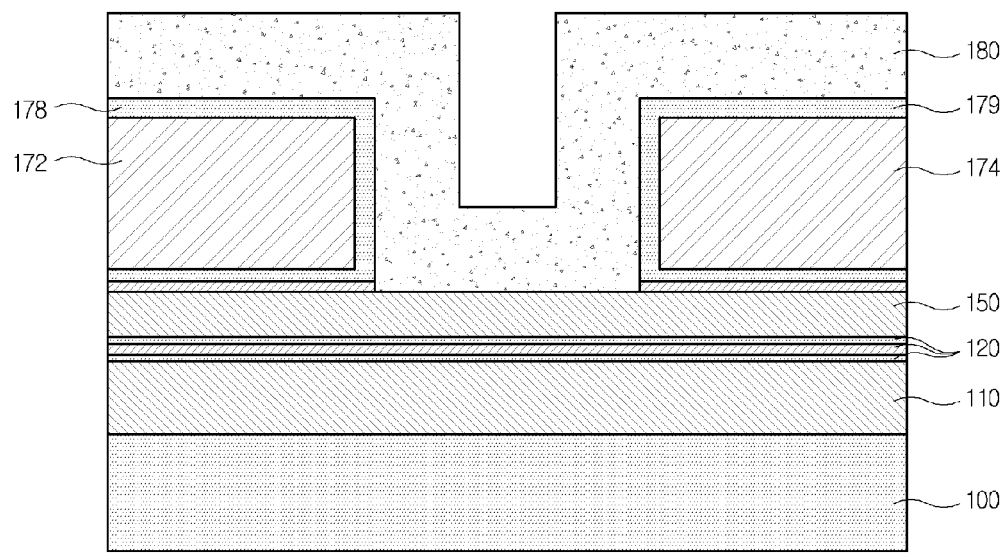
FIG. 13 is a cross-sectional diagram taken line I-I' of FIG. 11.
Figure 14:
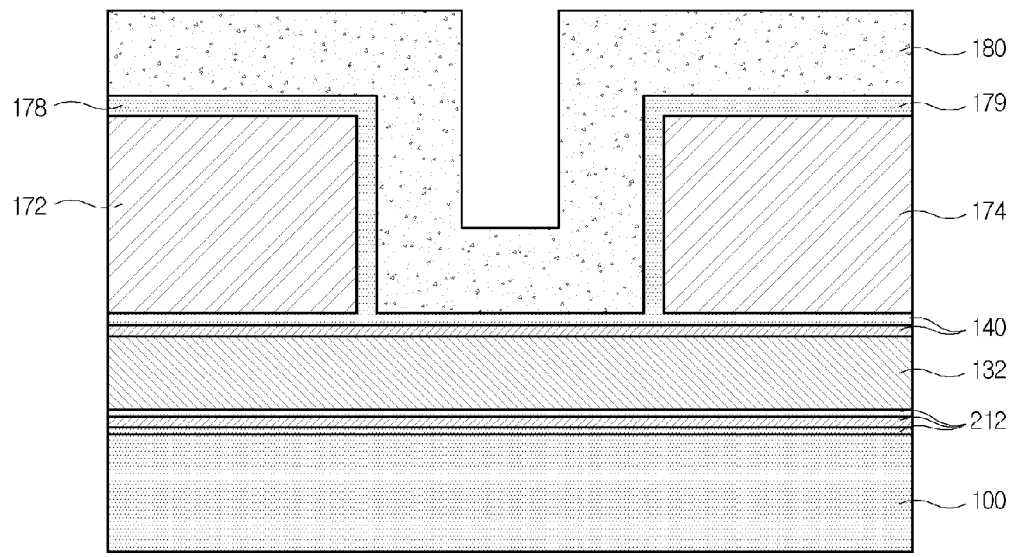
FIG. 14 is a cross-sectional diagram taken line H-H' of FIG. 11.

On the other hand, FIG. 11 is a perspective diagram illustrating another embodiment of the electrical contacts to the first and second semiconductor regions in the array structure of the neuromorphic device according to the present invention. FIG. 12 is a cross-sectional diagram taken along line F-F' of FIG. 11. FIG. 13 is a cross-sectional diagram taken along line I-I' of FIG. 11. FIG. 14 is a cross-sectional diagram taken along line H-H' of FIG. 11. Referring to FIGS. 12, 13, and 14, only the first and second semiconductor regions on the lower electrode are electrically connected to the first electrode 180. The voltages of the first and second semiconductor regions 150 and 152 where the channels are to be formed area controlled through the first electrode 180. Since the first and second semiconductor regions and the source 132 are applied with the same voltage in the feedback operation or the like, the first and second semiconductor regions and the source 132 may be electrically connected to each other. In the figures, the first electrode is formed on the first and second semiconductor regions.

Figure 15:
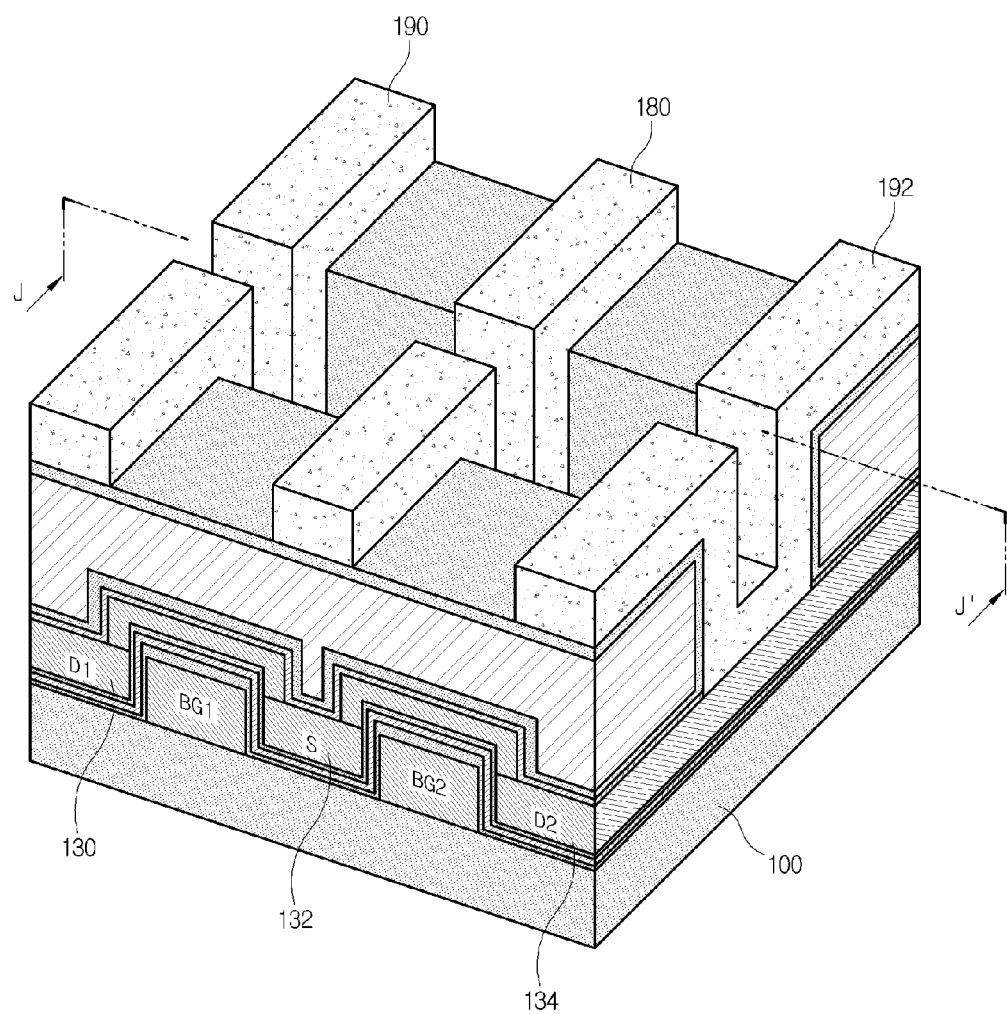
FIG. 15 is a perspective diagram illustrating an embodiment of contacts between the source and the drains D1 and D2 of the neuromorphic device in the array of the neuromorphic device according to the present invention.
Figure 16:
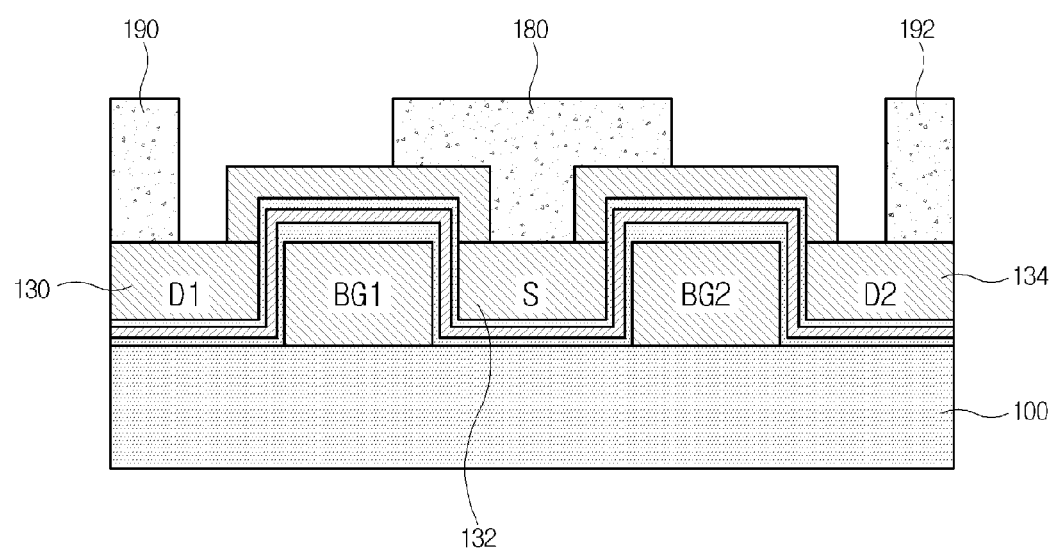
FIG. 16 is a cross-sectional diagram taken line J-J' of FIG. 15.

FIG. 15 is a perspective diagram illustrating an embodiment of contacts between the source and the drains D1 and D2 of the neuromorphic device in the array structure of the neuromorphic device according to the present invention. FIG. 16 is a cross-sectional diagram taken along line J-J' of FIG. 15. Referring to FIGS. 15 and 16, the first and second semiconductor regions and the source between the adjacent neuromorphic devices are electrically connected to each other by using the first electrode 180. The first drains (D1) as the first doped regions 130 between the adjacent neuromorphic devices are electrically connected by using the second electrode 190 electrically isolated from the first electrode 180. In addition, the second drains (D2) as the third doped region 134 between the adjacent neuromorphic devices are electrically connected by using the third electrode 192 electrically isolated from the first electrode. The connection of the drain regions between the adjacent neuromorphic devices in the array by using the second and third electrodes 190 and 192 is configured in order to reduce parasite resistance which may occur according to an increase in size of the array.

In FIG. 15, the first, second, and third electrodes are preferably formed with the same material in the same process simultaneously. However, the first, second, and third electrodes may be formed in different processes in order to improve the degree of integration or the like. In the case where the first, second, and third electrodes may be formed in different processes, the material of the second electrode 190 and the third electrode 192 may be different from that of the first electrode 180.

Heretofore, various configurations of connection of the first electrode to the first and second semiconductor regions in the array of the neuromorphic devices according to the first embodiment are described with reference to FIGS. 8 to 11. The configurations of connection of the first electrode can also be applied to the array of the neuromorphic devices according to the second embodiment of the present invention. In addition, the configuration of connection of the second electrode 190 to the first drain (D1) as the first doped region 130 and the configuration of connection of the third electrode 192 to the second drain (D2) as the third doped region 134 in the array of the neuromorphic devices according to the first embodiment are described with reference to FIG. 15. The configurations of connection of the second and third electrodes can also be applied to the array of the neuromorphic devices according to the second embodiment of the present invention.

Figure 17:
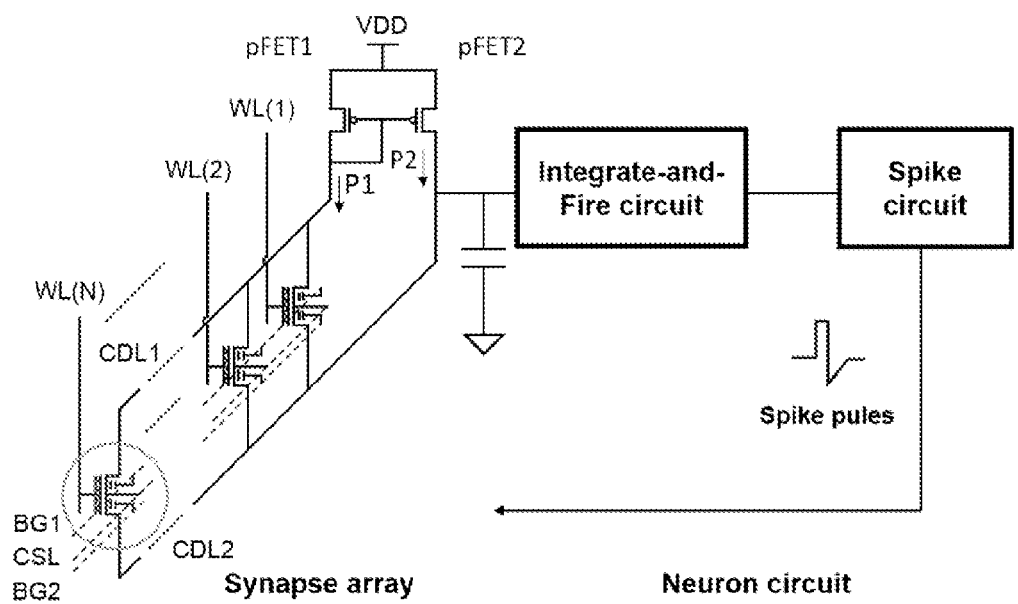
FIG. 17 is a circuit diagram illustrating a configuration where the neuromorphic device array and a neuron circuit through a current mirror circuit in the array of the neuromorphic device according to the present invention.

FIG. 17 illustrates a circuit diagram where the neuromorphic device array and the neuron circuit are connected to each other through the current mirror circuit in the array of the neuromorphic device according to the present invention. In each neuromorphic device, the first doped region (drain 1) 130 and the third doped region (drain 2) 134 are connected to the first common drain line (CDL1) and the second common drain line (CDL2) in the synapse array, respectively. In addition, the second doped region (source) 132 is connected to the common source line (CSL) in the synapse array. In addition, the upper electrodes 170 of the neuromorphic devices in the synapse array are denoted by a plurality of the upper electrodes (word lines WL1 . . . WL(N)). The first drain line of the synapse array is connected to the path 1 (P1) of the current mirror circuit. The second common drain line is connected to a node to which the path 2 (P2) of the current mirror circuit and one terminal of the capacitor (charge storage unit) are connected. When the current flowing through the first drain line is denoted by I1, the current I1 flows through the path 1 of the current mirror circuit. Assuming that the current of the path 1 is copied to the path 2 in a one-to-one manner, the current of the path 2 also becomes I1. When the current flowing through the second drain line is denoted by I2, the current of I1-I2 is flowed in to the electrode connected to the capacitor. If the current I1 is larger than the current I2, the capacitor voltage is increased. If the current I1 is smaller than the I2, the capacitor voltage is decreased. If the voltage of the charge storage unit exceeds a threshold value, the neuron circuit generates a spiking signal to transmit the signal to the next synapse. In addition, as described with reference to FIGS. 8 to 16, the spiking signal generated in the neuron circuit is fed back to the first and second semiconductor regions and the source, so that the weighting factor of the specified neuromorphic device in the STDP operation can be changed.

Since the neuromorphic device according to the present invention has a small occupation area, it is possible to increase a degree of integration. The neuromorphic device has a reliability based on silicon techniques. Since various functions required for a neuromorphic technique can be implemented, the neuromorphic device according to the present invention can be widely used in the field of the neuromorphic technique.

While the present invention has been particularly shown and described with reference to exemplary embodiments thereof, it will be understood by those skilled in the art that various changes and modifications in form and details may be made therein without departing from the spirit and scope of the present invention as defined by the appended claims.

What is claimed is:

1. A neuromorphic device comprising:
first, second, and third doped regions which are formed with a semiconductor material doped with impurities on a substrate to be electrically separated by a predetermined distance from each other and to be electrically isolated from each other;
a first lower electrode which is disposed between the first doped region and the second doped region to be electrically insulated from the first and second doped regions;
a second lower electrode which is disposed between the second doped region and the third doped region to be electrically insulated from the second and third doped region;
a first lower insulating film stack which is disposed at least on a surface of the first lower electrode;
a second lower insulating film stack which is disposed at least on a surface of the second lower electrode;
a first semiconductor region which is formed on a top surface of the first lower insulating film stack to connect the first doped region and the second doped region;
a second semiconductor region which is formed on a top surface of the second lower insulating film stack to connect the second doped region and the third doped region;
an upper insulating film stack which is formed on top surfaces of the first and second semiconductor regions; and
an upper electrode which is disposed on the upper insulating film stack.

2. The neuromorphic device according to claim 1, further comprising lower insulating film stacks between the substrate and the first doped region, between the substrate and the second doped region, and between the substrate and the third doped region.

3. The neuromorphic device according to claim 1, wherein each of the first and second lower insulating film stacks is configured in a structure where a plurality of layers including at least a charge storage layer and an insulating film are stacked.

4. The neuromorphic device according to claim 1, wherein the upper insulating film stack is configured with a single insulating material or in a stack structure where a plurality of layers including at least a charge storage layer and an insulating film are stacked.

5. The neuromorphic device according to claim 1, wherein the first and second lower insulating film stacks are configured so that each of the first and second lower insulating film stacks only on top surfaces of the first and second lower electrodes is configured in a stack structure where a plurality of layers including at least a charge storage layer and an insulating film are stacked and each of the first and second lower insulating film stacks on remaining regions is configured with a single insulating film.

6. The neuromorphic device according to claim 1, wherein each of the first and second lower insulating film stacks and the upper insulating film stack is configured in a stack structure where a plurality of layers including at least a charge storage layer and an insulating film are stacked, and the charge storage layer of each of the first and second lower insulating film stacks and the charge storage layer of the upper insulating film stack are different from each other in terms of a charge storage time interval.

7. The neuromorphic device according to claim 1, wherein a doped region formed to be doped with impurities of which type is different from that of the first, second, and third doped regions is further disposed on one side surface of the first and second semiconductor regions.

8. The neuromorphic device according to claim 1, wherein the first and second semiconductor regions are doped with impurities of which type is opposite to that of the first, second, and third doped regions.

9. The neuromorphic device according to claim 4, wherein in the case where the upper gate insulating film includes the charge storage layer and the insulating film, a program or erase operation is performed by injecting carriers (electrons or holes) from the upper electrode or the first and second semiconductor regions.

10. The neuromorphic device according to claim 6, wherein in the case where each of the first and second lower insulating film stacks and the upper insulating film stack is configured in the stack structure where a plurality of the layers including at least the charge storage layer and the insulating film are stacked, the charge storage layer is configured with an insulating film including traps, an insulating film including nano particles, or an electrode.

11. The neuromorphic device according to claim 1,
wherein each of the first and second lower insulating film stacks includes a charge storage layer, and
wherein positive or negative charges are stored in the charge storage layer so that threshold values of FETs formed in the first and second lower insulating film stacks are controlled.

12. A neuromorphic device array comprising a plurality of the neuromorphic devices according to claim 1,
wherein the neuromorphic devices share first and second lower electrodes and first, second, and third doped regions, and the neuromorphic devices are connected to each other through a plurality of upper electrodes which are electrically separated from each other.

13. The neuromorphic device array according to claim 12,
wherein first and second semiconductor regions are shared between the adjacent neuromorphic devices in the array configured with a plurality of the neuromorphic devices, and
wherein voltages of the first and second semiconductor regions and a voltage of the second doped region are controlled by using a first electrode which is electrically in contact with the first and second semiconductor regions shared between the adjacent neuromorphic devices and the second doped region.

14. The neuromorphic device array according to claim 12,
wherein first and second semiconductor regions are shared between the adjacent neuromorphic devices in the array configured with a plurality of the neuromorphic devices, and
wherein voltages of the first and second semiconductor regions are controlled by using a first electrode which is electrically in contact with the first and second semiconductor regions shared between the adjacent neuromorphic devices.

15. The neuromorphic device array according to claim 12,
wherein side surfaces of the first and second semiconductor regions are exposed between the adjacent neuromorphic devices in the array configured with a plurality of the neuromorphic devices, and
wherein voltages of the first and second semiconductor regions and a voltage of the second doped region are controlled by using a first electrode which is electrically in contact with the first and second semiconductor regions of which the side surfaces are exposed between the adjacent neuromorphic devices and the second doped region.

16. The neuromorphic device array according to claim 12,
wherein the first and second semiconductor regions are shared between the adjacent neuromorphic devices in the array configured with a plurality of the neuromorphic devices,
wherein voltages of the first and second semiconductor regions and a voltage of the second doped region are controlled by using a first electrode which is electrically in contact with the first and second semiconductor regions shared between the adjacent neuromorphic devices and the second doped region, and
wherein resistance is decreased by using second and third electrodes which are electrically separated from the first and third doped regions shared between the adjacent neuromorphic devices.

17. The neuromorphic device array according to claim 16, wherein the first, second, and third electrodes are formed with the same material.

18. The neuromorphic device array according to claim 12,
wherein each of the first and second lower insulating film stacks of each neuromorphic device of the neuromorphic device array includes a charge storage layer, and
wherein, in the case of selectively storing positive or negative charges in the charge storage layers of the first and second lower insulating film stacks of a specified neuromorphic device, a voltage is applied to the upper electrodes of the other neuromorphic devices, so that storing charges in the other neuromorphic devices is negligible.

19. The neuromorphic device array according to claim 12, wherein the first and third doped regions shared in the neuromorphic device array are formed to be connected to two respective independent paths of a current mirror circuit.

* * * * *